(12) United States Patent
Sasaki

(10) Patent No.: US 8,987,076 B2
(45) Date of Patent: Mar. 24, 2015

(54) METHOD OF MANUFACTURING TRANSISTOR

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/053,643

(22) Filed: Oct. 15, 2013

(65) Prior Publication Data

US 2014/0295635 A1 Oct. 2, 2014

(30) Foreign Application Priority Data

Mar. 27, 2013 (JP) ................. 2013-066674

(51) Int. Cl.
*H01L 21/66* (2006.01)
*H01L 29/66* (2006.01)
*H01L 21/02* (2006.01)

(52) U.S. Cl.
CPC .... *H01L 29/66477* (2013.01); *H01L 21/02458* (2013.01)
USPC .......................................... 438/186

(58) Field of Classification Search
None
See application file for complete search history.

(56) References Cited

U.S. PATENT DOCUMENTS

| 6,716,758 | B1 * | 4/2004 | Donohoe et al. | 438/706 |
| 8,030,638 | B2 * | 10/2011 | Kikkawa | 257/11 |
| 2001/0015437 | A1 * | 8/2001 | Ishii et al. | 257/12 |
| 2001/0033518 | A1 * | 10/2001 | Ayadi et al. | 365/201 |
| 2005/0218923 | A1 * | 10/2005 | Kutsuna | 324/765 |
| 2005/0236365 | A1 | 10/2005 | Komatani | |
| 2007/0114569 | A1 | 5/2007 | Wu et al. | |
| 2007/0141731 | A1 * | 6/2007 | Hemink et al. | 438/14 |
| 2007/0254483 | A1 * | 11/2007 | Bera et al. | 438/689 |

FOREIGN PATENT DOCUMENTS

| JP | EP0407169 | * | 7/1990 |
| JP | 5-304123 A | | 11/1993 |
| JP | 2000-174292 A | | 6/2000 |
| JP | 2004-31946 A | | 1/2004 |
| JP | 2005-317684 A | | 11/2005 |
| JP | 2009-507396 A | | 2/2009 |
| JP | 2012-104760 A | | 5/2012 |

OTHER PUBLICATIONS

D. Marcon et al.; "A Comprehensive Reliability Investigation of the Voltage-, Temperature- and Device Geometry-Dependence of the Gate Degradation on state-of-the-art GaN-on-Si HEMTs", *IEEE Intl. Electron Devices Meeting (IEDM)*, pp. 472-475 (Dec. 2010).

* cited by examiner

*Primary Examiner* — Evan Pert
*Assistant Examiner* — Herve Assouman
(74) *Attorney, Agent, or Firm* — Leydig, Voit & Mayer, Ltd.

(57) ABSTRACT

A method of manufacturing a transistor with suppressed characteristic variations caused by gate current, and a method of manufacturing an amplifier using such a transistor are provided. The transistor includes a SiC substrate, an AlGaN barrier layer, and a GaN buffer layer grown on the SiC substrate, a source electrode and a drain electrodes located on the AlGaN barrier layer, and a gate electrode connected to the AlGaN barrier layer via a Schottky junction. In a burn-in step, a gate voltage is applied to the transistor to cause a drain current Id to flow, and a drain voltage is applied to the transistor to heat the transistor to reduce the gate current of the transistor compared to the gate current before the burn-in.

7 Claims, 6 Drawing Sheets

METHOD OF MANUFACTURING TRANSISTOR

BACKGROUND OF THE INVENTION

1. Field of the Invention

The present invention relates to a method of manufacturing a transistor and a method of manufacturing an amplifier.

2. Background Art

There is known a conventional high-frequency nitride semiconductor transistor manufactured by allowing a GaN layer and an AlGaN layer to epitaxially grow on a substrate, forming a source electrode, a gate electrode and a drain electrode thereon and finally providing a nitride film as a protective film (e.g., see D. Marcon et al., "A Comprehensive Reliability Investigation of the Voltage-, Temperature- and Device Geometry-Dependence of the Gate Degradation on state-of-the-art GaN-on-Si HEMTs," IEEE International Electron Devices Meeting (IEDM), December 2010, p 472).

Although a silicon substrate is used in this transistor, a SiC substrate can also be used to form a transistor provided with a similar laminated structure, electrodes and protective film.

Other prior art includes Japanese Unexamined Patent Application Publication No. 2009-507396, Japanese Laid-Open Patent Publication No. 2012-104760, Japanese Laid-Open Patent Publication No. 2000-174292, Japanese Laid-Open Patent Publication No. 2005-317684, Japanese Laid-Open Patent Publication No. H5-304123, and Japanese Laid-Open Patent Publication No. 2004-31946.

A characteristic variation caused by a gate current has been a problem with the above conventional transistor. With Schottky junction type field-effect transistors (FETs), a certain range of voltage is applied between a gate electrode and a drain electrode so as to produce a reverse potential difference with respect to a Schottky barrier. In this case, electrons flow from the gate electrode into a semiconductor layer and are observed as a gate current.

When actually using this type of transistor in a circuit, a gate resistor may be connected in series to the gate electrode. A typical example of this is a case where the transistor is used for an amplifier. When the gate current is high, a voltage drop in this gate resistor increases. The variation in the gate current may cause the gate voltage to change, resulting in a problem that transistor operation is affected.

SUMMARY OF THE INVENTION

The present invention has been implemented to solve the above problem and it is an object of the present invention to provide a method of manufacturing a transistor capable of manufacturing a transistor with suppressed characteristic variations caused by a gate current and a method of manufacturing an amplifier using such a transistor.

According to a first aspect of the present invention, a method of manufacturing a transistor includes: a step of preparing a transistor provided with a semiconductor substrate; and a burn-in step. A nitride semiconductor layer is grown on the semiconductor substrate, a source electrode and a drain electrode are provided on the nitride semiconductor layer, and a gate electrode is connected to the nitride semiconductor layer by Schottky junction. The burn-in step applies a gate voltage to the transistor to cause a drain current to flow, applying a drain voltage thereto to heat the transistor and execute burn-in, and reducing a gate current of the transistor compared to that before the burn-in.

According to a second aspect of the present invention, a method of manufacturing a transistor includes: a step of preparing a semiconductor substrate; an etching step; and a step of forming the gate electrode. The semiconductor substrate is provided with a nitride semiconductor layer, a nitride insulating film is provided on the nitride semiconductor layer and a mask is provided on the nitride insulating film and the mask has an opening at a position where a gate electrode is formed. The etching step introduces the semiconductor substrate into a plasma etching apparatus and etches the nitride insulating film exposed from the opening using the plasma etching apparatus to expose the nitride semiconductor layer. The gate electrode is formed in the portion exposed from the nitride insulating film in the nitride semiconductor layer after the etching step. Wherein, in the etching step, no high-frequency power for attracting etching seeds to the semiconductor substrate is given to the semiconductor substrate.

According to a third aspect of the present invention, a method of manufacturing a transistor includes: a step of preparing a semiconductor substrate; an etching step; and a step of forming the gate electrode. The semiconductor substrate is provided with a nitride semiconductor layer, a nitride insulating film is provided on the nitride semiconductor layer and a mask is provided on the nitride insulating film and the mask has an opening at a position where a gate electrode is formed. The etching step introduces the semiconductor substrate into a plasma etching apparatus. The etching step etches the nitride insulating film exposed from the opening by generating plasma in the plasma etching apparatus and the etching step applies high-frequency power to the semiconductor substrate, and causing part of the nitride semiconductor layer to be exposed. The gate electrode is formed in the part of the nitride semiconductor layer after the etching step to form a transistor. Wherein, in the etching step, crystal defects which are stable under an operating voltage and an operating current of the transistor are uniformly formed in the part of the nitride semiconductor layer.

According to a fourth aspect of the present invention, a method of manufacturing an amplifier using a transistor manufactured using the method of manufacturing a transistor according to any one of the first to third aspects.

Other and further objects, features and advantages of the invention will appear more fully from the following description.

DETAILED DESCRIPTION OF THE PREFERRED EMBODIMENTS

First Embodiment

Figure 1:
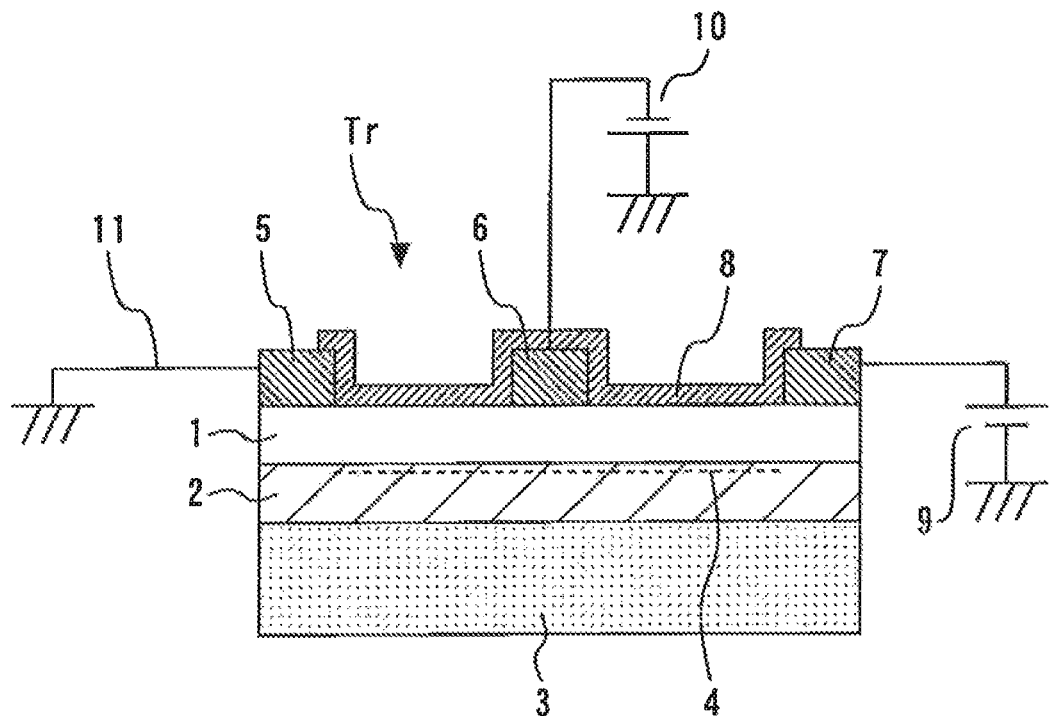
FIG. 1 illustrates a burn-in step of a method of manufacturing a transistor according to a first embodiment of the present invention.
Figure 2:
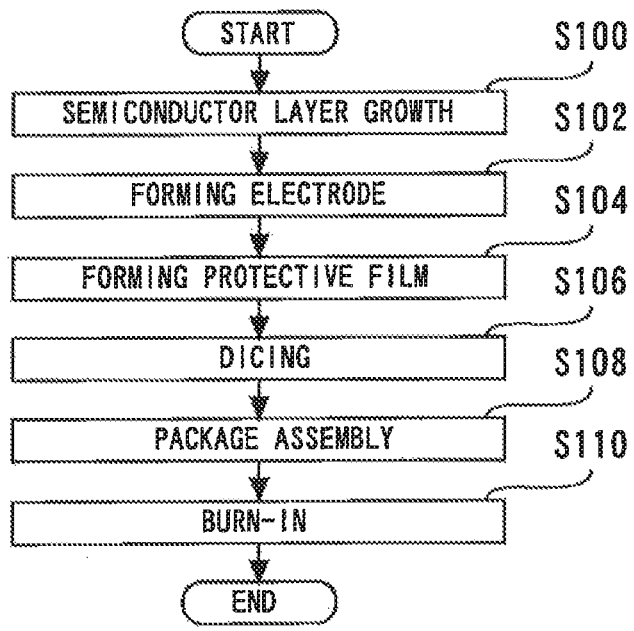
FIG. 2 is a flowchart of the method of manufacturing a transistor according to the first embodiment of the present invention.

FIG. 1 illustrates a burn-in step of a method of manufacturing a transistor according to a first embodiment of the present invention. FIG. 2 is a flowchart of the method of manufacturing a transistor according to the first embodiment of the present invention. The above configuration in FIG. 1 illustrates a situation of process of step S110 in FIG. 2. In the first embodiment, a burn-in step is performed on a transistor Tr in a condition shown in FIG. 1.

First, the transistor Tr to be subjected to burn-in in the first embodiment will be described. The transistor Tr according to the present embodiment is a high electron mobility transistor (HEMT) and FIG. 1 illustrates a general schematic cross-sectional view of the HEMT. The transistor Tr is provided with an AlGaN barrier layer 1 and a GaN buffer layer 2 which have grown on a SiC substrate 3. Both the AlGaN barrier layer 1 and the GaN buffer layer 2 correspond to a "nitride semiconductor layers which have grown on a semiconductor substrate" according to the present invention.

A source electrode 5 and a drain electrode 7, and a gate electrode 6 Schottky-connected to the AlGaN barrier layer 1 are provided on the AlGaN barrier layer 1. Predetermined regions of the source electrode 5, drain electrode 7 and gate electrode 6 are covered with a nitride film 8 as a protective film. The nitride film 8 is assumed to be a SiN film. Heterojunction between the AlGaN barrier layer 1 and the GaN buffer layer 2 exerts a spontaneous polarization and a piezoelectric effect, generating a two-dimensional electron gas (2DEG) 4.

Next, operation of the transistor Tr will be described. The source electrode 5 is grounded, a voltage of −4 V to −1 V is applied from a gate power supply 10 to the gate electrode 6 and a voltage of 10 V to 100 V is applied from a drain power supply 9 to the drain electrode 7.

This produces a flow of electrons of the two-dimensional electron gas (2DEG) 4 and a flow of a drain current Id. The drain current Id can be controlled by adjusting the voltage of the gate power supply 10. Applying a high-frequency signal to the gate electrode 6 allows the drain current Id to amplify a signal modulated at a frequency thereof.

Although not shown in the burn-in step in FIG. 1, in an amplifier manufactured using a high-frequency transistor, a gate resistor Rg is normally inserted in series in the circuit to prevent oscillation. When the transistor Tr is packaged as an amplifier, the gate resistor Rg is inserted in series. The nitride film 8 functions as a protective film to protect the transistor Tr from humidity, contamination or oxygen or the like.

Next, the manufacturing step according to the first embodiment will be described using the flowchart in FIG. 2.

(Step S100)

In the flowchart in FIG. 2, a semiconductor layer growth step is executed first. In this step, the GaN buffer layer 2 made of gallium nitrogen and the AlGaN barrier layer 1 made of aluminum gallium nitrogen are made to grow on the SiC substrate 3 in the stage of a semiconductor wafer.

(Step S102)

Next, an electrode formation step is executed. In this step, the source electrode 5, drain electrode 7 and gate electrode 6 are formed on the AlGaN barrier layer 1.

(Step S104)

Next, a protective film formation step is executed. In this step, the nitride film 8 is formed by selectively providing a SiN film on the semiconductor wafer after forming the above electrode.

(Step S106)

Next, dicing is executed. In this step, the semiconductor wafer on which a plurality of transistor elements are formed in steps S100 to S104 above is diced into semiconductor chips. A transistor Tr is formed on each individual semiconductor chip.

(Step S108)

Then, in the first embodiment, a package assembly step is performed on the semiconductor chip after the dicing. A plurality of packages are manufactured by executing a general package assembly step such as resin sealing. As a typical product example, the transistor Tr may be assembled as a transistor in an inner circuit of a high-frequency semiconductor amplifier and may be packaged together with other circuit elements through resin sealing or the like.

(Step S110)

Next, in the first embodiment, a burn-in step is performed on the semiconductor package completed through the above package assembly step. FIG. 1 schematically illustrates only the transistor Tr extracted from within the semiconductor package, showing a situation in which the transistor Tr is electrically connected to the drain power supply 9 or the like.

There are conventional techniques of executing burn-in by applying a high temperature and high voltage to a semiconductor device without allowing any drain current to flow thereinto, but even when such burn-in is performed on a nitride semiconductor, little effect of reducing the gate current is achieved. It is a new fact discovered by the present inventor that an effect of reducing the gate current is achieved through burn-in according to the present embodiment.

In the burn-in step according to the first embodiment, burn-in is performed by applying a gate voltage to the transistor Tr to flow a drain current and applying a drain voltage thereto to heat the transistor Tr. Executing this burn-in reduces the gate current of the transistor Tr compared to that before the burn-in.

That is, the present inventor discovered that it would be possible to reduce the gate current by executing burn-in with the drain voltage, drain current and heat of certain values or more applied to the nitride semiconductor transistor. In the transistor Tr, a drain voltage Vd is set to a relatively high voltage, for example, 30 V and a drain current Id of 200 mA/mm is made to flow. This causes a channel temperature (Tch) to rise due to power consumption and causes a gate current Ig to temporarily increase by thermal excitation. It has been proven for the first time that the temporal increase of the gate current Ig turns to a decrease in just several seconds.

Thus, the burn-in step according to the first embodiment assumes that such a degree of the drain current Id is made to flow into the transistor Tr that the gate current Ig of the transistor Tr temporarily increases after the burn-in starts and then turns to a decrease.

Moreover, it has also been proven that in an initial stage of the above burn-in, the gate current Ig drastically decreases, then gradually saturates and settled down to a substantially constant value in ten minutes or so. Thus, in the burn-in step according to the first embodiment, after the gate current Ig turns to a decrease in the initial stage of burn-in, the burn-in according to the first embodiment is continued for an extent of time during which the gate current Ig saturates. This ensures that the effect of stably suppressing the gate current is achieved.

Particularly, it has been proven that this gate current suppression phenomenon would be accelerated by applying a high drain voltage Vd, a high drain current Id and a high temperature to the transistor Tr. Therefore, it is preferable to apply a highest possible drain voltage, a highest possible drain current Id and a highest possible temperature to the transistor Tr within a range in which the transistor Tr is not destroyed.

When the transistor Tr is normally operated, the drain voltage is set to on the order of 20 V to 60 V and the drain current Id is set to on the order of 10 mA/mm to 100 mA/mm. No particularly great change occurs in the gate current Ig within the current/voltage range under this normal operation condition. In this respect, since the drain voltage Vd is set to a relatively high voltage, for example, 30 V and the drain current Id is set to 200 mA/mm, the current/voltage range in the burn-in of the present embodiment is obviously different from the aforementioned current/voltage range.

In the burn-in step according to the first embodiment, the transistor Tr is heated only through self-heating of the transistor Tr when power is supplied during the burn-in. That is, the burn-in generally practiced in conventional techniques creates a high temperature environment to place the device therein and then gives electric stress to the device in such an environment. On the other hand, the burn-in step according to the first embodiment applies a sufficiently high current and voltage to the transistor Tr, and thereby has an advantage that there is no need to create a high temperature environment and the burn-in step can also be practiced by using equipment at a room temperature.

It has also been discovered that the magnitude of the drain current Id to flow in the burn-in according to the first embodiment has a dependency on the gate width (Wg) of the transistor Tr. The gate width Wg is a length of the gate electrode 6 in the depth direction of the surface of the sheet in FIG. 1 and this definition is the same as that of technical common sense in this field.

Figure 3:
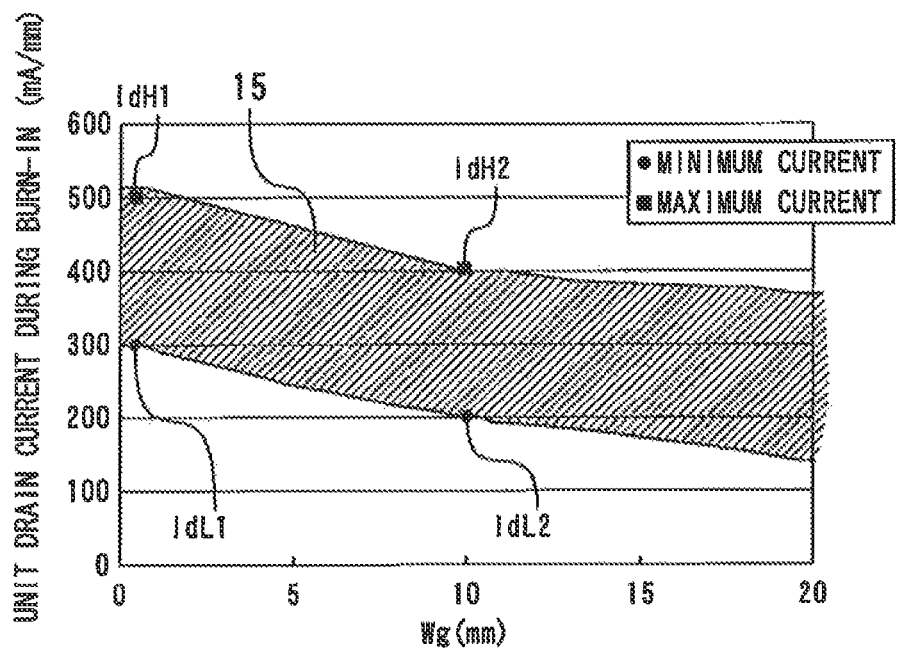
FIG. 3 is a graph illustrating a range of the drain current applied in the burn-in step in the method of manufacturing a transistor according to the first embodiment of the present invention.

FIG. 3 is a graph illustrating a range of the drain current Id applied in the burn-in step in the method of manufacturing a transistor according to the first embodiment of the present invention. In FIG. 3, the horizontal axis shows a gate width Wg and the vertical axis shows a drain current (unit: mA/mm) per unit gate width. The drain current (unit: mA/mm) per unit gate width is also referred to as a "unit drain current" for convenience.

In FIG. 3, four points of IdH1, IdL1, IdH2 and IdL2 are typically plotted. IdH2 is an upper limit current, that is, a maximum current within a range that the transistor Tr is not destroyed when the gate width Wg is 10 mm. IdL2 is a lower limit current, that is, a minimum current required to obtain a gate current suppression effect. IdH1 and IdL1 are a maximum current and a minimum current, respectively measured when the gate width Wg is smaller than that of IdH2 and IdL2.

A current range 15 is a burn-in current range in which the effect of reducing the gate current Ig is achieved and the transistor Tr is not adversely affected. This current range 15 has a tendency to decrease as a whole when the drain current Id is high and also has a tendency to decrease as a whole when an ambient temperature rises. Although an optimal range changes when the structure of the transistor Tr or the transistor Tr manufacturing process differs, the optimal range generally tends to continue to decrease with respect to the gate width Wg as shown in the current range 15 in FIG. 3.

In the case of a transistor Tr having Wg=500 µM, if the drain voltage is fixed to 30 V, a gate current reduction phenomenon starts at 300 mA/mm or higher. In the case of a transistor Tr having Wg=10 mm, at a drain voltage of 30 V, a gate current reduction phenomenon starts at 200 mA/mm or higher. In the case of a transistor Tr having Wg=100 µM, it has been revealed that a gate current reduction phenomenon hardly occurs at a drain voltage 30 V and a drain current of 400 mA/mm, but a gate current reduction phenomenon occurs when the drain voltage is further increased up to 40 V. According to the present embodiment, a gate length Lg of the gate electrode 6 is 0.5 µM. The gate length refers to the size of the gate electrode 6 in the horizontal direction on the surface of the sheet in FIG. 1.

The aforementioned tendency acquired by the present inventor shows a clear Wg dependency. The tendency indicates that the smaller the Wg of the transistor Tr, the higher drain voltage and the higher drain current Id are required. Thus, a condition of the burn-in step according to the first embodiment can be defined as follows.

With the transistor Tr according to the first embodiment, when the gate width Wg is 10 mm, the drain voltage is set to 30 V or more so that a drain current within a range of 200 mA or more and 400 mA or less per gate width of 1 mm flows. When the gate width Wg is smaller than 10 mm, the drain voltage is set to 30 V or more so that a drain current exceeding 200 mA per gate width of 1 mm flows. When the gate width Wg is more than 10 mm, the drain voltage is set to 30 V or less so that a drain current less than 200 mA per gate width of 1 mm flows.

Thus, the burn-in condition is adjusted in accordance with the gate width Wg of the transistor Tr so that a lower current flows through the transistor Tr having a smaller gate width Wg and the unit drain current decreases as the gate width Wg increases.

This makes it possible to supply a necessary current and voltage to the transistor Tr, ensure that burn-in capable of reducing the gate current is executed and effectively utilize a characteristic that the unit drain current can be reduced when the gate width Wg is large.

When the gate width Wg is large, it is difficult to cause a large unit drain current to flow. In this respect, the burn-in according to the first embodiment can effectively use the "characteristic that the unit drain current may be reduced as the gate width Wg increases" which can be read from FIG. 3. This makes it possible to cut on the drain current given to the transistor Tr and makes easier the burn-in step.

The dependency on the gate width Wg may be considered to occur because the greater the Wg, the higher the channel temperature during the burn-in and the burn-in effect appears conspicuously. When a high drain voltage Vd and a high drain current Id are applied, a high burn-in effect can be obtained, but the burn-in condition needs to be carefully selected because the transistor Tr is damaged by a heat or voltage. Therefore, it is preferable to select an appropriate burn-in condition in accordance with the gate width Wg of the transistor Tr.

Figure 4:
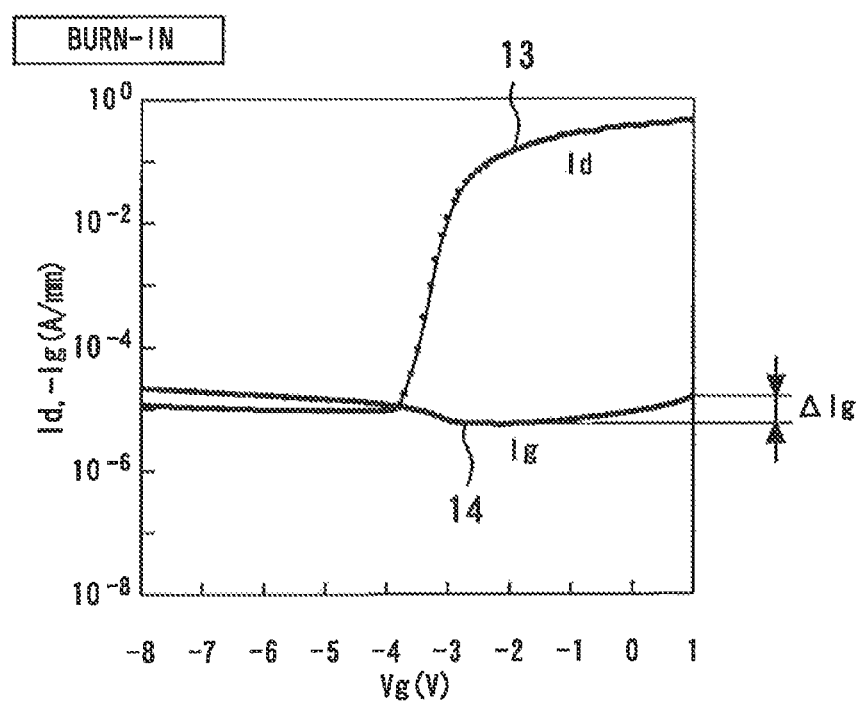
FIG. 4 and FIG. 5 show a characteristic graph indicating a variation of the drain current and a characteristic graph indicating a variation of the gate current when the gate voltage is changed.
Figure 5:
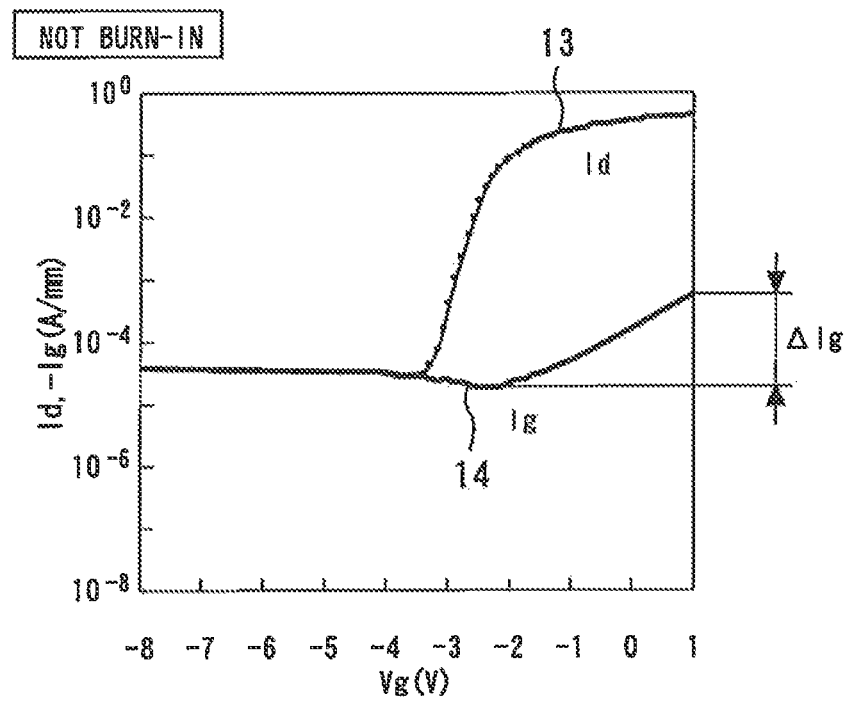

The gate current reduction effect achieved by the method of manufacturing a transistor according to the present embodiment will be described more specifically. FIG. 4 and FIG. 5 show a characteristic graph 13 indicating a variation of the drain current Id and a characteristic graph 14 indicating a variation of the gate current Ig when the gate voltage Vg is changed. A horizontal axis Vg in the drawings corresponds to the gate voltage Vg applied to the gate electrode 6 in the drain current Id/gate voltage Vg and gate current Ig/gate voltage Vg characteristics of the transistor Tr. Note that the gate current Ig is shown with a minus sign. The drain current Id and gate current Ig are expressed in a logarithmic form.

FIG. 4 illustrates transistor characteristics of the transistor Tr when the burn-in according to the first embodiment of the present invention is executed. When the gate voltage Vg is −4 V or less (−8 V to −4 V in the drawing), the drain current Id indicates $10^{-5}$ A/mm (per gate width 1 mm) This characteristic is measured at a drain voltage of 30 V.

Since a minus voltage is applied to the gate electrode 6, a depletion layer formed in a Schottky barrier between the gate electrode 6 and the nitride semiconductor layer extends up to the GaN buffer layer 2, and when the two-dimensional electron gas 4 is blocked, the drain current Id no longer flows.

A voltage of 34 V to 38 V is applied between the gate electrode and the drain electrode so as to become a reverse potential difference with respect to the Schottky barrier. Because of this potential difference, electrons flow from the gate electrode into the semiconductor and this flow is observed as the gate current Ig. Since most of electrons emitted from the gate flow into the drain, the gate current Ig and the drain current Id exhibit substantially the same value.

The current increases as the gate voltage Vg becomes negative (as the gate voltage Vg approaches −8 V) because the potential difference between the gate and drain increases and more gate current Ig flows. On the other hand, when the gate voltage Vg is between −3 V and +1 V, although the potential difference between the gate and drain is small, the gate current Ig increases as the gate is changed to a positive potential.

The reason for the increase of the gate current Ig is as follows: First, the drain current Id increases and a heat is thereby generated in the transistor Tr. The heat generation causes the channel temperature to rise. When the channel temperature rises, the number of electrons flowing from the gate electrode into the semiconductor increases due to thermal excitation. As a result, the gate current Ig increases.

FIG. 5 is shown as a comparative example and illustrates transistor characteristics of the transistor Tr when the burn-in according to the first embodiment is not executed. In the region where the gate voltage is between −2 V and +1 V, the gate current Ig is much more than the gate current Ig in FIG. 4 and is $10^{-3}$ A/mm when the gate voltage Vg is +1 V.

Here, a characteristic variation of the transistor caused by the gate current will be described. In an amplifier manufactured using a high-frequency transistor Tr, a gate resistor is normally inserted in series in the circuit to prevent oscillation. When the gate current is high, a voltage drop is produced at both ends of this gate resistor and a positive voltage rather than the applied gate power supply voltage is applied to the gate electrode and the drain current increases.

When the drain current increases, the channel temperature rises, the gate current increases, furthermore the gate voltage Vg shifts to a positive voltage and the drain current flows, that is, positive feedback takes place. This positive feedback may cause an unfavorable temperature rise. Although this may not lead to an excessive temperature rise, if the drain current fluctuates more than expected, the entire system may become unstable.

As shown in FIG. 4 and FIG. 5, when the burn-in according to the first embodiment is performed on the transistor Tr, the gate current Ig corresponding to a range of the gate voltage Vg in which the drain current Id flows (that is, the range in which the Vg is −3 V to +1 V) decreases. When a variation width ΔIg of the gate current Ig in FIG. 4 is compared with that in FIG. 5, ΔIg is obviously smaller in FIG. 4 with the burn-in, and it is clear that the burn-in according to the first embodiment achieves an effect of reducing the gate current Ig. After executing the burn-in according to the first embodiment, when the gate current Ig decreases, the fluctuation of the drain current Id decreases, and it is thereby possible to cause the transistor Tr to operate stably.

In the present embodiment, a test has been conducted on the stability of the gate current Ig. After executing burn-in, an RF energization test (Vd=30 V, ambient temperature 200° C., 1000 hours), a high-temperature off-bias test (Vd=30 V, Vg=−5 V, ambient temperature 175° C., 1000 hours) and a high-temperature storage test (320° C., 5 minutes) were conducted. As a result, the gate current Ig was stable without increasing again. This indicates that the transistor Tr whose gate current Ig is reduced by the burn-in according to the first embodiment has a sufficiently long-time reliability regarding its gate current Ig characteristic.

Modification Example of First Embodiment

In the flowchart in FIG. 2 of the first embodiment, manufacturing steps are executed in order of dicing, package assembly and burn-in.

However, the present invention is not limited to this. The burn-in step may also be executed such that burn-in is performed on a plurality of transistors Tr formed on a semiconductor wafer simultaneously or one by one before dicing. That is, the burn-in step may be executed in order of burn-in, dicing and package assembly.

Normally, semiconductor chip are often assembled into their respective packages and subjected to burn-in individually for the convenience of handling, and this scheme is adopted in the first embodiment. According to this burn-in method, burn-in needs to be executed on each individual transistor Tr, requiring time and trouble for replacing the package every time.

Figure 6:
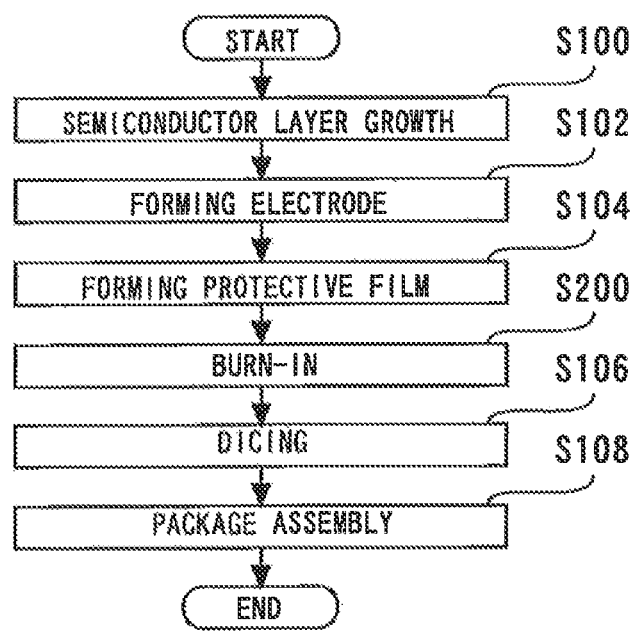
FIG. 6 is a flowchart illustrating a modification example of the method of manufacturing a transistor according to the first embodiment of the present invention.

Thus, in the present modification example, probing is performed on the respective transistors Tr in a semiconductor wafer state and the burn-in according to the first embodiment is performed to simplify this operation. FIG. 6 is a flowchart illustrating a modification example of the method of manufacturing a transistor according to the first embodiment of the present invention. The burn-in step executed in step S110 in FIG. 2 is deleted, and instead, a burn-in step (step S200) is inserted after a protective film formation step in step S104.

In this step S200, burn-in is performed on a plurality of transistors Tr simultaneously using a probe card provided with a plurality of probes. The burn-in condition such as the drain current and the drain voltage applicable to each transistor Tr is the same as that in step S110.

A plurality of transistors Tr are regularly arranged on the semiconductor wafer before dicing. For this reason, if a control program is created and executed so as to give a current or voltage to transistors Tr at the respective positions via the probe card, it is possible to perform burn-in successively on the transistors Tr on the entire semiconductor wafer.

During the burn-in, some semiconductor chips may be destroyed or exhibit characteristic defects, but by removing those chips, it is possible to cut on costs of the package material and package assembly.

However, the burn-in according to the first embodiment requires a current of several hundreds of mA/mm, and when the gate width is large, the current may reach several A. The size of a probe used for a normal wafer test is on the order of 50 μM at most. Since this type of probe is designed to be used to measure a current of 1 A or less, the current density of the probe needle becomes insufficient for performing the burn-in according to the first embodiment. Therefore, in the first embodiment, it is desirable to perform burn-in in a step different from the wafer test using a probe of 50 microns or more specialized for the burn-in.

Furthermore, as another modification example, a step of dicing the semiconductor wafer on which the transistors Tr are formed may be provided before the burn-in step. That is, dicing, burn-in and package assembly may be executed in this order. In the burn-in step, the burn-in may be performed on the transistors Tr formed in the semiconductor chip after dicing. In the present modification example, a semiconductor wafer is cut into a strip shape or cut one by one into chips with dicing, then transformed into individual semiconductor chips, subjected to probing and then burn-in.

Figure 7:
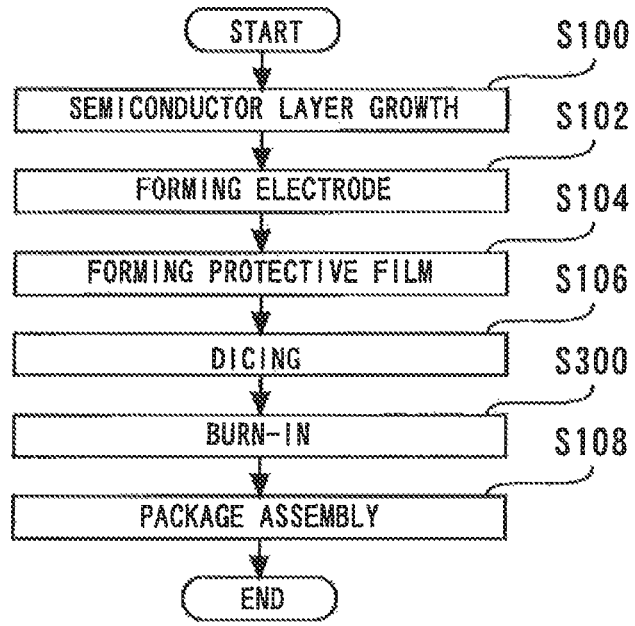
FIG. 7 is a flowchart illustrating a modification example of the method of manufacturing a transistor according to the first embodiment of the present invention.

FIG. 7 is a flowchart illustrating a modification example of the method of manufacturing a transistor according to the first embodiment of the present invention. The burn-in step executed in step S110 in FIG. 2 is deleted, and instead, a burn-in step (step S300) is inserted after the dicing step in step S106.

In this step S300, individual semiconductor chips are respectively subjected to probing and then the burn-in according to the first embodiment is executed. The burn-in condition such as the drain current and drain voltage is the same as that in step S110.

When individual chips are separated from one wafer, a thickness reduction step by grinding of the back surface of the wafer and a dicing step are necessary. During these steps, not little mechanical stress or vibration or crack may be applied, adversely affecting the transistors Tr. Performing burn-in in the chip state makes it possible to perform burn-in while making a check including damages caused in these steps.

The first embodiment has described a laminated structure of the AlGaN layer/GaN layer/SiC layer which is a typical HEMT structure, but the present invention is not limited to this. The nitride semiconductor layer according to the present embodiment may be one or more semiconductor layers laminated together, selected from a group of nitride gallium layer, nitride aluminum layer and nitride aluminum gallium layer.

To be more specific, the following epitaxial laminated structure may also be adopted in addition to the first embodiment. For example, similar effects can be obtained with structures such as an AlGaN layer/GaN layer/AlN layer/SiC substrate, GaN layer/AlGaN layer/GaN layer/SiC substrate, AlGaN layer/AlN layer/GaN layer/SiC substrate, or AlGaN layer/AlGaN layer/SiC substrate. The modifications of the materials for the epitaxial layer described here are likewise applicable to the following embodiments.

Although the transistor Tr is assumed to be a depression type HEMT, the present invention is not limited to this. The transistor Tr may be an enhancement type HEMT.

Second Embodiment

Figure 8:
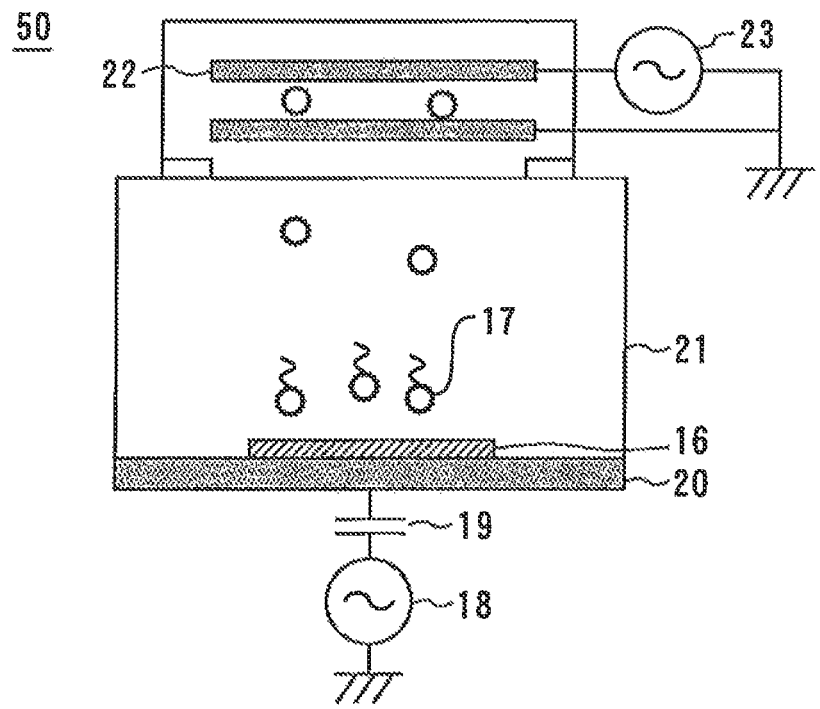
FIG. 8 is a cross-sectional view illustrating an internal configuration of an etching apparatus used for a method of manufacturing a transistor according to a second embodiment of the present invention.
Figure 9:
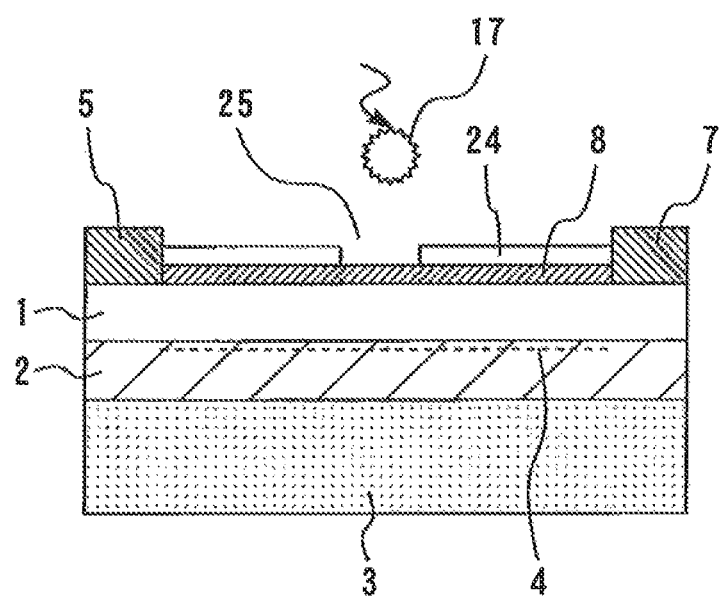
FIG. 9 is a schematic view illustrating an etching step of the method of manufacturing a transistor according to the second embodiment of the present invention.
Figure 10:
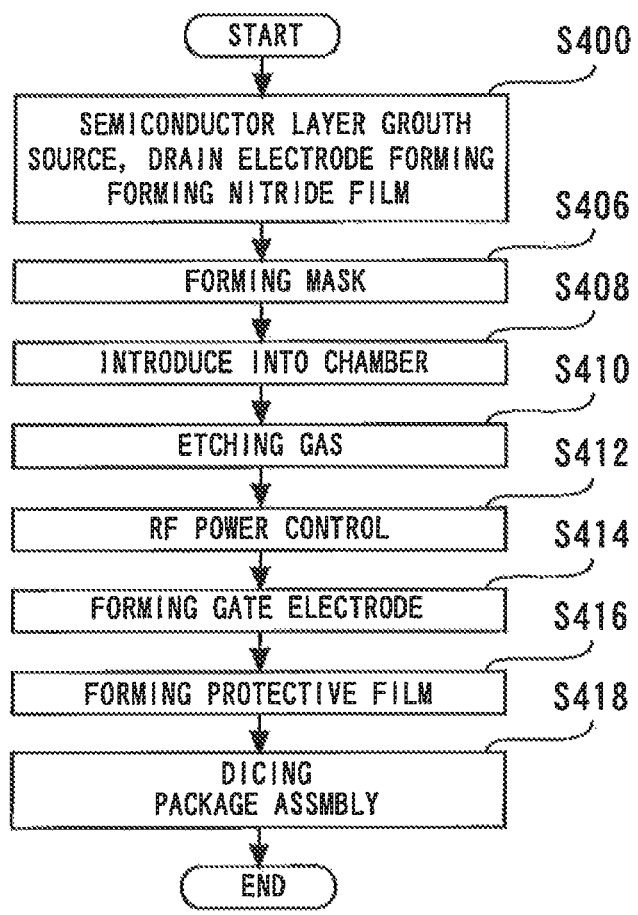
FIG. 10 is a flowchart of the method of manufacturing a transistor according to the second embodiment of the present invention.

FIG. 8 is a cross-sectional view illustrating an internal configuration of an etching apparatus used for a method of manufacturing a transistor according to a second embodiment of the present invention. FIG. 9 is a schematic view illustrating an etching step of the method of manufacturing a transistor according to the second embodiment of the present invention. FIG. 10 is a flowchart of the method of manufacturing a transistor according to the second embodiment of the present invention.

The method of manufacturing a transistor according to the second embodiment is intended to reduce damage to the semiconductor layer during processing on the gate caused by etching and reduce the gate current Ig. In this respect, the contents thereof are different from those of the first embodiment in which burn-in is improved.

An etching apparatus 50 shown in FIG. 8 is an inductively coupled plasma (ICP) etching apparatus often used to form a gate electrode. The etching apparatus 50 is provided with a chamber 21. A lower electrode 20 is provided inside the chamber 21 and a semiconductor wafer 16 is arranged on the lower electrode 20. The lower electrode 20 also plays a role of supporting the semiconductor wafer as well as transmitting a high frequency generated in a power supply 18 to the chamber 21.

An upper electrode 22 is provided at the top of the chamber 21. The upper electrode 22 receives a supply of RF power from a power supply 23, and can thereby decompose a gas. As a result, etching species 17 of the gas excited in a reduced pressure ambient (e.g., on the order of 1 Pa) of a mixture of $CHF3$ and $O2$ are generated. A power supply 18 supplies RF power to the semiconductor wafer 16. A capacitor 19 which transmits RF power and cuts a DC component is inserted between the lower electrode 20 and the power supply 18.

With reference to the flowchart in FIG. 10, the method of manufacturing a transistor according to the second embodiment will be described.

(Step S400)

According to the flowchart in FIG. 10, a semiconductor layer growth step, formation of the source electrode and drain electrode, and formation of the nitride film are performed. In this step, first, a GaN buffer layer 2 made of gallium and nitrogen, and an AlGaN barrier layer 1 made of aluminum, gallium and nitrogen are made to grow on a SiC substrate 3 in a semiconductor wafer stage.

Next, a source electrode 5, a drain electrode 7, and a nitride film 8 which is a nitride insulating film are formed on the AlGaN barrier layer 1. Although a more specific method of manufacturing is not questioned, after forming, for example, the nitride film 8 on the entire surface, openings may be formed by etching at the source electrode formation position and the drain electrode formation position and an electrode material may be laminated thereon.

(Step S406)

Next, by forming a mask 24 having an opening 25 on the semiconductor wafer (that is, on the nitride film 8), the structure shown in FIG. 9 is obtained.

(Step S408)

After that, the semiconductor wafer provided with the structure shown in FIG. 9 is introduced into the chamber 21 of the etching apparatus 50 and placed on the lower electrode 20.

(Step S410)

Next, the chamber 21 is filled with an etching gas. In the second embodiment, a gas for etching the nitride semiconductor layer is used, and more specifically the etching gas is assumed to be a mixed gas of $CHF3$ and $O2$. Furthermore, the interior of the chamber 21 has a decompressed (e.g., on the order of 1 Pa) atmosphere.

(Step S412)

Next, RF power control is performed. When RF power of approximately 100 W is supplied to the upper electrode 22, the gas in the vicinity of the upper electrode 22 is decomposed or radicalized. As a result, the etching gas is excited and the etching seeds 17 are generated.

Here, if RF power on the order of 10 W is applied to the lower electrode 20, the etching species 17 are attracted to the semiconductor wafer 16, collide with the semiconductor wafer 16 at a certain speed and etching is performed. Thus, RF power is conventionally applied to the lower electrode 20.

However, the present inventor made every effort to discover the following new etching technique. That is, when the etching occurs at a high speed because of the RF power supplied to the lower electrode 20, the etching species 17 may cause damage to the AlGaN barrier layer 1. This damage causes crystalline defects such as point defects. Such point defects are considered to become sources of the gate current Ig.

Thus, the present inventor reduced the RF power of the power supply 18 and finally stopped the power supply to reduce this damage, and discovered that the nitride film 8 could still be etched although the etching speed decreased by a certain degree.

The etching gas is radicalized at the upper electrode 22. For this reason, even when the etching seeds 17 reach the semiconductor wafer 16 by only diffusion, chemical etching takes place. It is assumed from this that the nitride film 8 is etched.

It has been proven that the gate current Ig is reduced in the transistor Tr manufactured by etching the electrode without supplying the RF electrode to the lower electrode 20 to form the opening 25 in this way and forming the gate electrode 6 in the opening 25. This is because since there is no etching damage, the occurrence of crystal defects was suppressed and the gate current Ig could thereby be reduced. Thus, the present inventor discovered a new etching technique of not supplying RF power to the lower electrode 20 normally used for the ICP apparatus.

In step S412, as described above, RF power is applied to the upper electrode 22 to generate the etching species 17, whereas no RF power is supplied to the lower electrode 20. By providing the mask 24 to protect part of the nitride film 8 in this way, the nitride film 8 exposed from the opening 25 is etched and an opening for forming the gate electrode is formed in the nitride film 8. Part of the AlGaN barrier layer 1 is exposed by this opening for forming the gate electrode.

(Step S414)

After the etching step, the gate electrode 6 is formed at the portion where the AlGaN barrier layer 1 is exposed. The mask 24 is also removed as appropriate.

(Step S416)

After that, a protective film to protect the surface of the gate electrode 6 is formed.

(Step S418)

After that, the semiconductor wafer is divided into semiconductor chips through dicing, and the individual semiconductor chips are assembled into their respective packages.

According to the method of manufacturing according to the second embodiment described above, it is possible to manufacture a transistor Tr whose gate current is suppressed.

Third Embodiment

The method of manufacturing a transistor according to a third embodiment of the present invention is provided with manufacturing steps similar to those of the method of manufacturing a transistor according to the second embodiment except the way an etching apparatus 50 supplies RF power (to be more specific, the presence or absence of an RF power supply to a lower electrode 20). In the third embodiment, RF power to the lower electrode 20 is increased beyond a conventional operating range. In this respect, the third embodiment is different from the second embodiment in which RF power to the lower electrode 20 is eliminated.

Describing the third embodiment with reference to the flowchart in FIG. 10, the contents of step S412 are different from those of the second embodiment. In the third embodiment, crystal defects are uniformly formed at positions of the AlGaN barrier layer 1 where the gate electrode is formed in step S412. These crystal defects are formed so as to be stable under an operating voltage and an operating current of the transistor Tr. In the first embodiment, more specifically, the etching apparatus 50 sets RF power to be supplied from the power supply 18 to the lower electrode 20 to 50 W or more.

The conventional ICP etching apparatus normally applies power on the order of 10 W to the lower electrode. If etching is performed on the nitride film 8 with RF power of this magnitude, crystal defects in a quasi-stable state are formed in the AlGaN barrier layer 1. The state (e.g., the number) of crystal defects in a quasi-stable state changes due to electric stress or heat while the transistor Tr is operating. The change in the number of crystal defects in the AlGaN barrier layer 1 causes the gate current Ig to change.

When RF power to be supplied to the lower electrode 20 in the etching apparatus 50 is set to 50 W or more, it has been proven that stable crystal defects less susceptible to electric stress are generated in the AlGaN barrier layer 1. The value of the gate current Ig of the transistor Tr manufactured using this manufacturing method is high to some extent.

However, since the crystal defects are in a stable state, the magnitude of the gate current Ig is stable. This suppresses characteristic fluctuations of the transistor caused by fluctuations of the gate current Ig and operational convenience of the transistor Tr improves. According to the third embodiment, it is possible to manufacture the transistor Tr capable of maintaining stable characteristics using a method different from the burn-in according to the first embodiment.

As a modification example of the method of manufacturing a transistor according to the third embodiment, the RF power to be supplied to the lower electrode 20 may be increased to 100 W or more. The present inventor has also discovered a new fact that the gate current Ig decreases when the RF power is drastically increased to this extent. Thus, the RF power to be supplied to the lower electrode 20 may be set to 100 W or more. In this case, however, although there is an effect of stabilizing characteristics of the gate current, the initial drain current Id decreases.

The method of manufacturing a transistor according to the third embodiment described above need not execute the burn-in according to the first embodiment, and therefore has an advantage of being able to manufacture the transistor Tr at low cost. Furthermore, there are products in which higher importance is attached to the stability of transistor characteristics, while allowing the power density that the transistor Tr outputs to be smaller. For such a product, it is preferable to use transistors manufactured using the manufacturing method according to the third embodiment.

The features and advantages of the present invention may be summarized as follows. According to the present invention, it is possible to manufacture a transistor with suppressed characteristic variations caused by a gate current and an amplifier using such a transistor.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-066674, filed on Mar. 27, 2013, including specification, claims, drawings, and summary, on which the Convention priority of the present application is based, is incorporated herein by reference in its entirety.

The invention claimed is:

1. A method of manufacturing a transistor comprising:
preparing a transistor including a semiconductor substrate, a nitride semiconductor layer grown on the semiconductor substrate, a source electrode and a drain electrode located on the nitride semiconductor layer, and a gate electrode connected to the nitride semiconductor layer via a Schottky junction; and applying a gate voltage to the gate electrode of the transistor, and applying a drain voltage to the drain electrode of the transistor to cause a sufficient drain current to flow in the transistor to heat and burn-in the transistor, so that gate current of the transistor increases temporarily, after starting of the burn-in, and, thereafter, decreases so that the gate current of the transistor, compared to the gate current before the burn-in of the transistor, is decreased.

2. The method of manufacturing a transistor according to claim 1, wherein, after the gate current decreases in after the starting of the burn-in, continuing the burn-in until the gate current saturates.

3. The method of manufacturing a transistor according to claim 1, including, in the burn-in, heating the transistor only by self-heating from the flow of the drain current.

4. The method of manufacturing a transistor according to claim 1, wherein in the burn-in, when gate width of the gate electrode is 10 mm, setting the drain voltage to at least 30 V and producing a drain current in a range from 200 mA to 400 mA per millimeter of gate width, when the gate width is smaller than 10 mm, setting the drain voltage to at least 30 V and producing a drain current exceeding 200 mA per millimeter of gate width, and when the gate width is more than 10 mm, setting the drain voltage to no more than 30 V and producing a drain current of less than 200 mA per millimeter of gate width.

5. The method of manufacturing a transistor according to claim 1, wherein the semiconductor substrate is a silicon carbide substrate, and including forming the nitride semiconductor layer by laminating one or more semiconductor layers selected from the group consisting of a gallium nitride layer, an aluminum nitride layer, and an aluminum gallium nitride layer.

6. The method of manufacturing a transistor according to claim 1, further comprising dicing the semiconductor substrate on which the transistor is formed, before the burn-in, wherein the burn-in is performed on the transistor after the dicing.

7. The method of manufacturing a transistor according to claim 1, including forming a plurality of the transistors on the semiconductor substrate, and in the burn-in, burning-in the plurality of the transistors on the semiconductor substrate simultaneously or one-by-one.

* * * * *